(12) United States Patent
Trottier (10) Patent No.: US 10,168,030 B2
(45) Date of Patent: Jan. 1, 2019

(54) LED LAMP WITH FUSIBLE METAL HEAT MANAGEMENT ELEMENTS

(71) Applicant: CREE, INC., Durham, NC (US)

(72) Inventor: Troy A. Trottier, Cary, NC (US)

(73) Assignee: Cree, Inc., Durham, NC (US)

( * ) Notice: Subject to any disclaimer, the term of this patent is extended or adjusted under 35 U.S.C. 154(b) by 318 days.

(21) Appl. No.: 14/620,516

(22) Filed: Feb. 12, 2015

(65) Prior Publication Data

US 2016/0238230 A1   Aug. 18, 2016

(51) Int. Cl.
| | | |
|---|---|---|
| F21V 29/00 | (2015.01) | |
| F21V 19/00 | (2006.01) | |
| F21V 29/77 | (2015.01) | |
| F21V 29/89 | (2015.01) | |
| F21K 9/232 | (2016.01) | |
| F21K 9/278 | (2016.01) | |
| H05K 1/02 | (2006.01) | |
| F21Y 115/10 | (2016.01) | |
| F21Y 107/30 | (2016.01) | |

(52) U.S. Cl.
CPC ............ *F21V 19/004* (2013.01); *F21K 9/232* (2016.08); *F21K 9/278* (2016.08); *F21V 29/773* (2015.01); *F21V 29/89* (2015.01); *F21Y 2107/30* (2016.08); *F21Y 2115/10* (2016.08); *H05K 1/0209* (2013.01)

(58) Field of Classification Search
CPC ...... F21V 19/004; F21V 29/773; F21V 29/89; F21K 9/278; F21K 9/232; F21Y 2107/30; F21Y 2115/10; H05K 1/0209
See application file for complete search history.

(56) References Cited

U.S. PATENT DOCUMENTS

| | | | |
|---|---|---|---|
| 6,452,217 B1 | 9/2002 | Wojnarowski | |
| 7,965,023 B1 | 6/2011 | Liang | |
| 8,272,762 B2 | 9/2012 | Maxik et al. | |
| 8,282,249 B2 | 10/2012 | Liang et al. | |
| 8,427,037 B2 | 4/2013 | Liang et al. | |
| 8,556,465 B2 | 10/2013 | Lee et al. | |
| 2007/0259160 A1* | 11/2007 | Huang | H05K 3/0061 428/209 |
| 2009/0117316 A1* | 5/2009 | Kao et al. | F28F 1/16 428/66.6 |
| 2011/0317438 A1* | 12/2011 | Erhard et al. | F21K 9/00 362/382 |
| 2015/0043212 A1* | 2/2015 | Coffey et al. | F21V 23/045 362/294 |

* cited by examiner

*Primary Examiner* — Y M. Lee
(74) *Attorney, Agent, or Firm* — Myers Bigel, P.A.

(57) ABSTRACT

A light emitting diode (LED) lamps and methods of providing heat management with fusible metals associated with the heat management components. More particularly, the present disclosure provides LED lamps fusible metal components that are situated between LED components and heat sink components of the LED lamp.

22 Claims, 8 Drawing Sheets

LED LAMP WITH FUSIBLE METAL HEAT MANAGEMENT ELEMENTS

TECHNICAL FIELD

The present disclosure relates to light emitting diode (LED) lamps and methods of providing heat management with fusible metals associated with the LED lamp. More particularly, the present disclosure relates to LED lamps comprising low melting metal or fusible metal components that are situated between LED components and heat management components of the LED lamp.

BACKGROUND

Since, ideally, an LED lamp designed as a replacement for a traditional incandescent or fluorescent light source needs to be self-contained; a power supply is included in the lamp structure along with the LEDs or LED packages and the optical components. A heatsink is also often needed to cool the LEDs and/or power supply in order to maintain appropriate operating temperature. The power supply and especially the heatsink can often effect the color and luminosity of the light coming from the LEDs or limit LED placement. Depending on the type of traditional bulb for which the solid-state lamp is intended as a replacement, this limitation can cause the solid-state lamp to have a shorter life than could be obtained and/or emit light substantially different than the light pattern produced by the traditional light bulb that it is intended to replace.

SUMMARY

In some embodiments, a heat sink assembly comprises an LED mount portion having an external surface; and a fusible metal layer deposited on at least a portion of the external surface. In one aspect, the fusible metal layer conforms to at least a portion of the external surface of the LED mount portion.

In another aspect, alone or in combination with any previous aspect, the LED mount portion comprises a substantially cylindrical side surface extending from a base, the side surface terminating in a transverse top surface. In another aspect, alone or in combination with any previous aspect, the top surface is an interior annular wall terminating at the top surface. In another aspect, alone or in combination with any previous aspect, the fusible metal layer is at least partially deposited on the interior annular wall.

In another aspect, alone or in combination with any previous aspect, the fusible metal is a material with a thermal conductivity different from the LED mounting portion. In another aspect, alone or in combination with any previous aspect, the fusible metal layer has a melting temperature between 40° C. and 200° C. In another aspect, alone or in combination with any previous aspect, the fusible metal comprises two or more metals of indium (In), bismuth (Bi), lead (Pb), tin (Sn), cadmium (Cd), zinc (Zn), and thallium (Tl). In another aspect, alone or in combination with any previous aspect, the fusible metal is indium.

In some embodiments, a lamp comprises a base having an electrical outlet and an open end separated from the base by an interior space; an LED board; comprising at least one LED operable to emit light when energized through an electrical path from the base; and a heat sink assembly comprising a fusible metal layer, at least a portion of the fusible layer adjacent to the external surface and adjacent to the LED board.

In one aspect, the lamp further comprising an LED mount portion having an external surface, wherein the external surface is substantially cylindrical and terminates in a transverse top surface, wherein the fusible metal layer at least partially surrounds the external surface. In another aspect, alone or in combination with any previous aspect, the top surface is an interior annular wall terminating at the top surface. In another aspect, alone or in combination with any previous aspect, the fusible metal layer is at least partially deposited on the interior annular wall.

In another aspect, alone or in combination with any previous aspect, the fusible metal is a material with a thermal conductivity different from the LED mounting portion. In another aspect, alone or in combination with any previous aspect, the fusible metal layer has a melting temperature between 40° C. and 200° C. In another aspect, alone or in combination with any previous aspect, the fusible metal comprises two or more metals of indium (In), bismuth (Bi), lead (Pb), tin (Sn), cadmium (Cd), zinc (Zn), and thallium (Tl). In another aspect, alone or in combination with any previous aspect, the fusible metal is indium.

In another aspect, alone or in combination with any previous aspect, the LED board is planar and is transverse to a longitudinal axis of the lamp, the LED board having an external perimeter surface, wherein the fusible metal layer is adjacent the external perimeter surface. In one aspect, the fusible metal layer is adjacent to a surface of the planar LED board opposite that having the at least one LED.

In some embodiments, a method of heat management of an LED lamp comprises positioning a fusible metal layer between a LED board and a LED mounting portion of a heat sink assembly, the fusible metal layer thermally coupling the LED board and the LED mounting portion.

In one aspect, the positioning comprises hot dip coating the LED mounting portion in a molten bath of the fusible metal. In another aspect, alone or in combination with any previous aspect, the positioning step comprises spray or sputter coating the LED mounting portion with the fusible metal. In another aspect, alone or in combination with any previous aspect, the position step comprises spray or sputter coating the LED board with the fusible metal. In another aspect, alone or in combination with any previous aspect, the fusible metal layer comprises a metal foil.

In another aspect, alone or in combination with any previous aspect, the fusible metal layer conforms to at least a portion of a space created between the LED mount portion and the LED board. In another aspect, alone or in combination with any previous aspect, the method further comprises the step of conforming at least a portion of a space created between the LED mount portion and the LED board occurs during normal operation of the LED lamp. In another aspect, alone or in combination with any previous aspect, the method further comprises the step of conforming at least a portion of a space created between the LED mount portion and the LED board occurs prior to normal operation of the LED lamp. In another aspect, alone or in combination with any previous aspect, the fusible metal layer reduces the operating LED board temperature by at least 5° C.

DETAILED DESCRIPTION

In some embodiments, LED light bulbs have an LED tower design. In the tower design LED lamps, a metal or metal core PCB board (herein after also referred to as the "LED board") is bent and press fit down around the tower (herein after also referred to as the "LED mounting portion"), leaving an interface between the LED board and the metal tower itself. This interface reduces heat transfer and as a result, the performance of the LED lamp. Thus, the present disclosure provides for fusible metal layer to occupy and/or otherwise conform with the interface between the LED board and the LED mounting portion.

Embodiments of the present disclosure now will be described more fully hereinafter with reference to the accompanying drawings, in which embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region or substrate is referred to as being "on" or extending "onto" or "deposited on" another element, it can be directly on or extend directly onto the other element or intervening elements may also be present. In contrast, when an element is referred to as being "directly on" or "deposited directly on" or "deposited directly" or extending "directly onto" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise, it will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this present disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

As used herein, "fusible metal" is a metal or an alloy, the term is inclusive of a composition comprising at least one metal, the composition capable of a thermal transition, e.g., melting or eutectic point between about 40° C. to below 200° C. In some embodiments, the fusible metal is indium. In some embodiments, the fusible metals are "fusible alloys" inclusive of eutectic alloys and solder, in some embodiments, the fusible alloys are inclusive of alloys comprising two or more metals of bismuth, lead, tin, cadmium, zinc, indium and thallium. In some embodiments, the fusible alloys are inclusive of alloys comprising three or more metals of bismuth, lead, tin, cadmium, zinc, indium and thallium. In some embodiments, the fusible alloys are inclusive of alloys comprising four or more metals of bismuth, lead, tin, cadmium, zinc, indium and thallium. In some embodiments, the fusible alloys are inclusive of alloys comprising five or more metals of bismuth, lead, tin, cadmium, zinc, indium and thallium. Other fusible metals can be used provided that they have a melting temperature between 40° C. and 200° C.

While is it possible that solder can be of similar composition, the presence of solder typically deployed for electrical connection is not to be inferred as the equivalent of a fusible metal "layer" of the present disclosure. In some embodiments, the fusible metal layer can be continuous, a web, or strips. In some embodiments, the fusible metal layer can cover or be deposited on substantially all (more than 50%, more than 75%, more than 90%) of a contacting surface of at least one component and that of the contacting surface of another component of the heat management system.

A solid-state lighting system, e.g., a LED lighting system or device, may take the form of a lighting unit, light fixture, light bulb, or a "lamp." Embodiments of the present disclosure provide a solid-state lamp with centralized light emitters, more specifically, LEDs (hereinafter, interchangeably used with "LED lamp" or "LED bulb" Multiple LEDs can be used together, forming an LED array. The LEDs can be mounted on or fixed within the lamp in various ways. It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture for mounting on walls, in or on ceilings, on posts, and/or on vehicles.

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in the lamp.

In many applications, including LED lamps, it is necessary to mount electronics boards such as a printed wiring board (PWB), printed circuit board (PCB), lead frame structure, metal core board, metal core printed circuit board, FM PCBs, extruded submounts, hybrid combinations of such structures, or other similar structures or combinations of such structures. The term "board" as used herein means an electronics board for mounting electronic components ("electronics" as used herein) such as LEDs, drivers, power supplies and/or the like including the types of electronics boards described above where at least a portion of the electrical path to the electrical components is supported on or forms part of the board. In many applications, the mounting of such electronic boards may require the mounting and electrical coupling of multiple electronics boards that may be oriented in different planes. While the electrical interconnect of the disclosure is described with reference to an LED lamp, the interconnect may be used to mount combinations of electronics boards in other devices where the interconnect may be advantageously used.

In some embodiments, a lamp comprises a base having an electrical connector. At least one LED is operable to emit light when energized through an electrical path from the base. A LED board is in the electrical path and supports the at least one LED. The LED board may be mounted on a heat sink or its assembly components. The LED board may be mounted directly on the heat sink or its assembly components, including a heat spreader plate. The LED board is configured with one or more apertures for receiving an electrical interconnect. A lamp electronics board is in the electrical path and is electrically coupled to the base. The electrical interconnect extends through the aperture and comprises an electrical conductor connecting the LED board to the lamp electronics board. The electrical interconnect may extend through as second aperture in the heat sink. A snap-fit connector may connect the electrical interconnect to the heat sink. The heat sink or its assembly components may separate the LED board from the base.

Fusible Metals

In some embodiments, the fusible metal is indium (In) that is essentially pure (e.g., 99.9% pure), however, some impurity is acceptable if the melting point is not increased above 200° C. or reduced below 40° C.

In one aspect, indium foil is used. The indium fail can between 0.001 (254 micron) to about 0.1 inches (2540 micron) thick. Foils of other fusible metals can be used. Other thickness of foil can be used depending on the tolerance fit between the LED board and the LED mount portion of the heat sink assembly components and/or the heat capacity and/or the melting temperature of the fusible metal.

A compression fit or swage fit is not necessary or required, but can be employed to assure intimate contact of the foil with both the LED board and the LED mount portion of the heat sink assembly component. In some embodiments, the fusible metal layer has a thermal conductivity different from components in contact with it. For example, the fusible metal layer can have a thermal conductivity less than, more than, or essentially the same as the LED mounting portion or the LED board.

In some embodiments, the fusible metal is a fusible alloy comprising two or more metals of indium, bismuth (Bi), lead (Pb), tin (Sn), cadmium (Cd), zinc (Zn), and thallium (Tl). In some embodiments, the fusible alloys are alloys comprising three or more metals of indium, bismuth (Bi), lead (Pb), tin (Sn), cadmium (Cd), zinc (Zn), and thallium (Tl). In some embodiments, the fusible alloys are alloys comprising four or more metals of indium, bismuth, lead, tin, cadmium, zinc and thallium. In some embodiments, the fusible alloys are alloys comprising five or more metals of indium, bismuth, lead, tin, cadmium, zinc and thallium.

Various fusible metals were examined to determine potential thermal benefit in as 100 W A21 light bulb. In some examples, foils of the fusible metals were used.

In some embodiments, a hot-dip bath can be used to dip coat a section of the LED mount portion of the heat sink assembly.

The addition of the fusible metals reduced the operating LED board temperature by ~5 C in all cases. Some examples of fusible metals suitable for the practice of the present disclosure provided in the table below:

TABLE 1

Examples of Fusible Metals for Practicing the Present Disclosure

| Metal or Alloy Composition (wt %) | Melting Point ° C. |
|---|---|
| Bi 40.3: Pb 22.2: In 17.2: Sn 10.7: Cd 8.1: Tl 1.1 | 41.5 |
| Bi 40.63: Pb 22.1: In 18.1: Sn 10.65: Cd 8.2 | 46.5 |
| Bi 32.5: In 51.0: Sn 16.5 | 60.5 |
| Bi 49.5: Pb 27.3: Sn 13.1: Cd 10.1 | 70.9 |
| Bi 50.0: Pb 25.0: Sn 12.5: Cd 12.5 | 71 |
| In 66.3: Bi 33.7 | 72 |
| Bi 50: Pb 30: Sn 20: Impurities | 92 |
| Bi 52.5: Pb 32.0: Sn 15.5 | 95 |
| Bi 50.0: Pb 31.2: Sn 18.8 | 97 |
| Bi 50.0: Pb 28.0: Sn 22.0 | 109 |
| Bi 56.5: Pb 43.5 | 125 |
| Bi 58: Sn 42 | 139 |
| Indium | 157 |
| Sn 62.3: Pb 37.7 | 183 |
| Sn 63.0: Pb 37.0 | 183 |
| Sn 91.0: Zn 9.0 | 198 |
| Sn 92.0: Zn 8.0 | 199 |

Diffusers/Phosphors/Spectral Notch Filters

In some embodiments, the LED lamp can further comprise one or more of a diffusing material and/or phosphors and/or spectral notch filter compounds (e.g. rare-earth element compounds). Thus, a phosphor and/or diffuser and/or notch filter can be added, incorporated therein, associated therewith, and/or combined with the LED elements or the enclosure of the lamp. Phosphors include, for example, commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white-light emitting LED chips include, for example: $Tb_{3-x}RE_xO_{12}$:Ce (TAG), where RE is Y, Gd, La, Lu; or $Sr_{2-x-y}Ba_xCa_ySiO_4$:Eu.

Some phosphors appropriate for these structures can comprise, for example: Red $Lu_2O_3$:Eu$^{3+}$ $(Sr_{2-x}La_x)$ $(Ce_{1-x}Eu_x)O_4Sr_2Ce_{1-x}Eu_xO_4Sr_{2-x}Eu_xCeO_4SrTiO_3$:Pr$^{3+}$,Ga$^{3+}$ $CaAlSiN_3$:Eu$^{2+}$Sr$_2$Si$_5$N$_8$:Eu$^{2+}$ as well as $Sr_xCa_{1-x}$S:EuY, where Y is halide; $CaSiAlN_3$:Eu; and/or $Sr_{2-y}Ca_ySiO_4$:Eu. Other phosphors can be used to create color emission by converting substantially all light to a particular color. For example, the following phosphors can be used to generate green light: $SrGa_2S_4$:Eu; $Sr_{2-y}Ba_ySiO_4$:Eu; or $SrSi_2O_2N_2$:Eu.

By way of example, each of the following phosphors exhibits excitation in the UV emission spectrum, provides a desirable peak emission, has efficient light conversion, and has acceptable Stokes shift, for example: Yellow/Green: $(Sr, Ca, Ba)(Al, Ga)_2S_4$:Eu$^{2+}$Ba$_2$(Mg,Zn)Si$_2$O$_7$:Eu$^{2+}$ $Gd_{0.46}Sr_{0.31}Al_{1.23}O_xF_{1.38}$:Eu$^{2+}$0.06 $(Ba_{1-x-y}Sr_xCa_y)SiO_4$:Eu $Ba_2SiO_4$:Eu$^{2+}$.

The lighting device can comprise solid-state light sources arranged with one or more phosphors so as to provide at least one of blue-shifted yellow (BSY), blue-shifted green (BSG), blue-shifted red (BSR), green-shifted red (GSR), and cyan-shifted red (CSR) light. Thus, for example, a blue LED with a yellow emitting phosphor radiationally coupled thereto and absorbing some of the blue light and emitting yellow light provides for a device having BSY light. Likewise, a blue LED with a green or red emitting phosphor radiationally coupled thereto and absorbing some of the blue light and emitting green or red light provides for devices having BSG or BSR light, respectively. A green LED with a red emitting phosphor radiationally coupled thereto and absorbing some of the green light and emitting red light provides for a device having GSR light. Likewise, a cyan LED with a red emitting phosphor radiationally coupled thereto and absorbing some of the cyan light and emitting red light provides for a device having CSR light.

Diffusers include light reflecting particles, for example, from material of high index of refraction. The high index of refraction material can be any material with an index of refraction of greater than about 2, greater than about 2.2, and greater than or equal to about 2.4, such as titanium dioxide, aluminum oxide, zinc oxide, zinc sulfide and combinations thereof. The average particle size of the diffuser particles can be between about 1 nanometer (nanoparticles) to about 500 microns. The diffuser can be added alone or in combination with the phosphor to the LED elements, the enclosure or to a coating applied to the lamp or its components.

Spectral notch compounds, e.g., rare-earth metal compounds, include compounds of neodymium, didymium, dysprosium, erbium, holmium, praseodymium and thulium, such as their oxides, halogens, nitrates, acetates, hydroxides, phosphates, sulfates, and hydrates thereof, for example, neodymium(III)nitrate hexahydrate(Nd(NO$_3$)$_3$.6H$_2$O); neodymium(III)acetate hydrate(Nd(CH$_3$CO$_2$)$_3$.xH$_2$O); neodymium(III)hydroxide hydrate(Nd(OH)$_3$); neodymium(III)phosphate hydrate(NdPO$_4$.H$_2$O); neodymium(III)carbonate hydrate(Nd$_2$(CO$_3$)$_3$.xH$_2$O); neodymium(III)isopropoxide (Nd(OCH(CH$_3$)$_2$)$_3$); neodymium(III)titanante (Nd$_2$O$_3$.xTiO$_2$); neodymium(III)chloride hexahydrate (NdCl$_3$.6H$_2$O); neodymium(III)fluoride (NdF); neodymium(III)sulfate hydrate(Nd$_2$(SO$_4$)$_3$.xH$_2$O); neodymium(III) oxide(Nd$_2$O$_3$); erbium(III)nitrate pentahyrdrate (Er(NO$_3$)$_3$.5H$_2$O); erbium(III)oxalate hydrate(Er$_2$(C$_2$O$_4$)$_3$.xH$_2$O); erbium(III) acetate hydrate(Er(CH$_3$CO$_2$)$_3$.xH$_2$O); erbium(III)phosphate hydrate(ErPO$_4$.xH$_2$O); erbium(III)oxide(Er$_2$O$_3$); Samarium(III)nitrate hexahydrate (Sm(NO$_3$)$_3$.6H$_2$O); Samarium(III)acetate hydrate(Sm(CH$_3$CO$_2$)$_3$.xH$_2$O); Samarium(III)phosphate hydrate (SmPO$_4$xH$_2$O); Samarium(III)hydroxide hydrate (Sm(OH)$_3$.xH$_2$O); samarium(III)oxide(Sm$_2$O$_3$); holmium(I-II)nitrate pentahydrate(Ho(NO$_3$)$_3$.5H$_2$O); holmium(III)acetate hydrate((CH$_3$CO$_2$)$_3$Ho.xH$_2$O); holmium(III)phosphate (HoPO$_4$); and holmium(iii)oxide (Ho$_2$O$_3$). Other rare earth metal compounds, including, organometallic compounds of neodymium, didymium, dysprosium, erbium, holmium, praseodymium and thulium can be used.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

LED lamps of any variety and/or shape can be used in the practice of the present disclosure. In one example, LED lamps with longitudinally extending projections having arranged or placed thereon, one or more LEDs are employed in the methods herein disclosed.

By way of example, LED lamps are disclosed as exemplary lighting devices suitable for the present disclosure. The lamp may also comprise as directional lamp such as BR-style lamp or a PAR-style lamp where the LEDs may be arranged on as longitudinally extending projection to provide directional light, with or without reflecting surfaces. In other embodiments, the LED lamp can have any shape, including standard and non-standard shapes.

Thus, with reference to FIGS. 1A, 1B, 2A, 2B, having globe shaped main body 114, comprises a solid-state lamp comprising a LED assembly 130 with light emitting LEDs 127. Multiple LEDs 127 can be used together, forming an LED array 128. The LEDs 127 can be mounted on or fixed within the lamp in various ways. The LEDs 127 of LED array 128 are mounted on a LED board 129 and are operable to emit light when energized through an electrical connection. In the present disclosure the term "submount" is used to refer to the support structure that supports the individual LEDs or LED packages and in one embodiment comprises a PCB although it may comprise other structures such as a lead frame extrusion, MCPCB, or the like or combinations of such structures. The LEDs 127 in the LED array 128 include LEDs which may comprise an LED die disposed in an encapsulant such as silicone, and LEDs which may be encapsulated with a phosphor to provide local wavelength conversion when various options for creating white light are discussed. A wide variety of LEDs and combinations of LEDs may be used in the LED assembly 130. FIG. 18 is a partial exploded view of lamp 100 having fusible metal layer 69 on outer surface of LED mounting portion 152. Fusible metal layer 69 can be on inside surface of the LED mounting portion 152 and/or the inside surfaces of the LED board 129.

In some embodiments, as shown in FIGS. 1A, 1B, 2A, 2B, the LED mounting portion comprises a planar transverse top surface 168 and a side surface 152a. The side surface 152a can be substantially cylindrical. In another aspect, the side surface has at least one faceted surface. The faceted surface can be angled relative to the longitudinal axis of between zero degrees and 70 degrees. In another aspect, a the at least one faceted surfaces forms an angle between 10 degrees and 45 degrees relative to the longitudinal axis. The side surface can have at least two faceted surfaces, any of the at least two faceted surfaces forming different angles relative to the longitudinal axis of the lamp.

In some embodiments, different types of LEDs are possible, such as XLamp® XB-D LEDs manufactured by Cree, Inc. or others. Other arrangements of chip on board LEDs and LED packages may be used to provide LED based light equivalent to 40, 60 and/or greater other watt incandescent light bulbs, at about the same or different voltages across the LED array 128. In other embodiments, the LED assembly 130 can have different shapes, such as triangular, square and/or other polygonal shapes with or without curved surfaces.

Figures 1A, 1B:
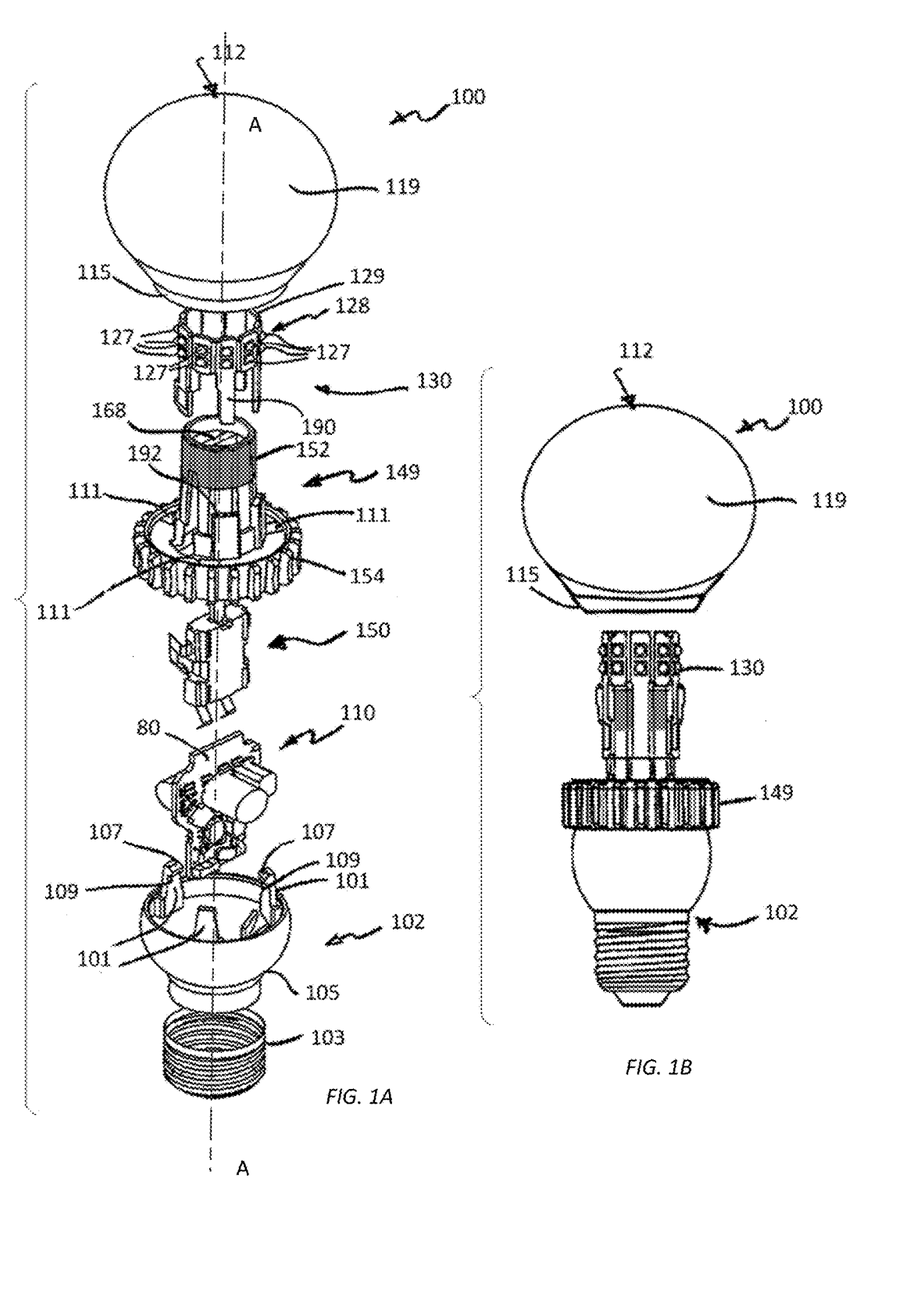
FIG. 1A is an exploded perspective view of an exemplary LED lamp usable in embodiments of the present disclosure.
FIG. 1B is a partial exploded view of a section of the LED lamp of FIG. 1A with a fusible metal in accordance with embodiments of the present disclosure.

Still referring to FIGS. 1A, 1B, a modified base 102 is shown comprising a two part base having an upper part 102a that is coupleable to enclosure 112 and a lower part 102b that is joined to the upper part 102a via securing mean 101 having latches 107 on inward surface 109 that engage cutouts 192. An Edison screw 103 is formed on the lower part 102b for connecting to an Edison socket. The base 102 may be connected to the enclosure 112 by any suitable mechanism including adhesive, welding, mechanical connection or the like, and may be connected and/or sealed using fusible metal as disclosed herein. The lower part 102b is joined to the upper part 102a by any suitable mechanism including adhesive, welding, mechanical connection or the like. The base 102 may be made reflective to reflect light generated by the LED lamp. The base 102 may be provided with a larger diameter at an intermediate portion thereof, the internal volume of the base expanded over that provided by a cylindrical base for receiving and retaining a power supply/drivers 110 in the base. Additional heat management components can be used, such as fins 154. The LED assembly 130 may be mounted to a LED mounting portion 152 of heat sink assembly 149 and provided an electrical interconnect 150 where the electrical interconnect 150 provides the electrical connection between the LED assembly 130 and the lamp electronics, e.g., power supply/drivers 110.

The exemplary LED lamp 100 merely illustrates an embodiment that, among other things, can serve as a replacement for an incandescent bulb. Lamp 100 may be used as an A-series lamp with an Edison base 102, more particularly; lamp 100 is designed to serve as a solid-state replacement for an A19 incandescent bulb. The Edison base 102 as shown and described herein may be implemented through the use of an Edison connector 103 and a plastic form. The LEDs 127 in the LED array 128 may comprise an LED die and optionally with LEDs that are encapsulated with a phosphor to provide local wavelength conversion when various options for creating white light are desired. The LEDs 127 of LED array 128 are mounted on a LED board 129 and are operable to emit light when energized through an electrical connection. Extensions 190, as shown, may be formed on the LED assembly ("LED tower") that connect the LED assembly 130 to a LED mounting portion 152 that positions and supports the LEDs 127 in the proper position. In some embodiments, a driver or power supply may be included with the LED array on the submount. In some cases, the driver may be formed by components on a printed circuit board or "PCB". While a lamp having the size and form factor of a standard-sized household incandescent bulb is shown, the lamp may have other the sizes and form factors. For example, the lamp may be a PAR-style lamp such as a replacement for a PAR-38 incandescent bulb.

Enclosure 112 is, in some embodiments, made of a frangible material, such as glass, quartz, borosilicate, silicate, or ceramic or other suitable material. The enclosure may be of similar shape to that commonly used in household incandescent bulbs. In some embodiments, the glass enclosure is coated on the inside with silica or other diffusive material such as refractory oxides, providing a diffuse scattering layer that produces a more uniform far field pattern. The enclosure may also be etched, frosted and coated with the protective layer as disclosed herein. Alternatively, the surface treatment may be omitted and as clear enclosure may be provided. It should also be noted that in this or any of the embodiments shown here, the optically transmissive enclosure or a portion of the optically transmissive enclosure could be coated or impregnated with phosphor or a diffuser. The glass enclosure 112 may have a traditional bulb shape having a globe shaped main body 114 that tapers to a narrower neck 115.

A lamp base 102 such as an Edison base functions as the electrical connector to connect the lamp 100 to an electrical socket or other connector. Depending on the embodiment, other base configurations are possible to make the electrical connection such as other standard bases or non-traditional bases. Base 102 may include the electronics 110 for powering lamp 100 and may include a power supply and/or driver and form all or a portion of the electrical path between the mains and the LEDs. Base 102 may also include only part of the power supply circuitry while some smaller components reside on the submount. With the embodiment of FIGS. 1A and 1B, as with many other embodiments of the present disclosure, the term "electrical path" can be used to refer to the entire electrical path to the LED array 128, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LED array. Electrical conductors run between the LED assembly 130 and the lamp base 102 to carry both sides of the supply to provide critical current to the LEDs 127.

The LED assembly 130 may be implemented using a printed circuit board ("PCB") and may be referred by in some cases as an LED PCB. In some embodiments, the LED PCB comprises the LED board 129. The lamp 100 comprises a solid-state lamp comprising a LED assembly 130 with light emitting LEDs 127. Multiple LEDs 127 can be used together, forming an LED array 128. The LEDs 127 can be mounted on or fixed within the lamp in various ways. In at least some example embodiments, a LED board 129 is used. The LEDs 127 in the LED array 128 include LEDs which may comprise an LED die disposed in an encapsulant such as silicone, which is separate and apart from the presently disclosed transparent dielectric composition, and the LEDs may be encapsulated with a phosphor to provide local wavelength conversion. A wide variety of LEDs and combinations of LEDs may be used in the LED assembly 130 as described herein. The LEDs 127 of the LED array 128 are operable to emit light when energized through an electrical connection. An electrical path runs between the LED board 129 and the lamp base 102 to carry both sides of the supply to provide critical current to the LEDs 127.

Still referring to FIGS. 1A-2B, in some embodiments, a driver and/or a power supply are included with the LED array 128 on the LED board 129. In some embodiments, the driver and/or power supply are included in the base 102 as shown. The power supply and drivers may also be mounted separately where components of the power supply are mounted in the base 102 and the driver is mounted with the LED board 129 in the enclosure 112. Base 102 may include a power supply or driver and form all or a portion of the electrical path between the mains and the LEDs 127. The base 102 may also include only part of the power supply circuitry while some smaller components reside on the LED board 129. In some embodiments, any component that goes directly across the AC input line may be in the base 102 and other components that assist in converting the AC to useful DC may be in the glass enclosure 112. In one example embodiment, inductors and capacitor that form part of the EMI filter are in the Edison base.

In some embodiments, a gas movement device may be provided within the enclosure 112 to increase the heat transfer between the LEDs 127 and LED assembly 130 and heat sink 149. The movement of the gas over the LED assembly 130 moves the gas boundary layer on the components of the LED assembly 130. In some embodiments the gas movement device comprises a small fan. The fan may be connected to the power source that powers the LEDs 127. While the gas movement device may comprise an electric fan, the gas movement device may comprise a wide variety of apparatuses and techniques to move air inside the enclosure such as a rotary fan, a piezoelectric fan, corona or ion wind generator, synjet diaphragm pumps or the like.

The LED assembly 130 comprises a LED board 129 arranged such that the LED array 128 is substantially in the center of the enclosure 112 such that the LED's 127 are positioned at the approximate center of enclosure 112. As used herein the term "center of the enclosure" refers to the vertical position of the LEDs in the enclosure as being aligned with the approximate largest diameter area of the globe shaped main body 114. In some embodiments, the LED array 128 is arranged in the approximate location that the filament is disposed in a standard incandescent bulb. The present disclosure provides a fusible metal layer deposited on the LED mounting portion 152 or the side of the LED board 129 that contacts the LED mounting portion for one or more of the above configurations.

Figure 2A:
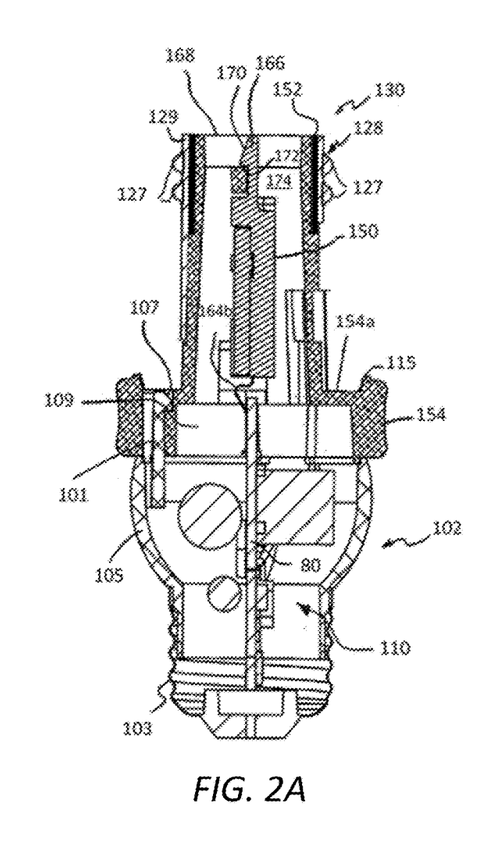
FIG. 2A is a section view taken along line A-A of FIG. 1.
Figure 2B:
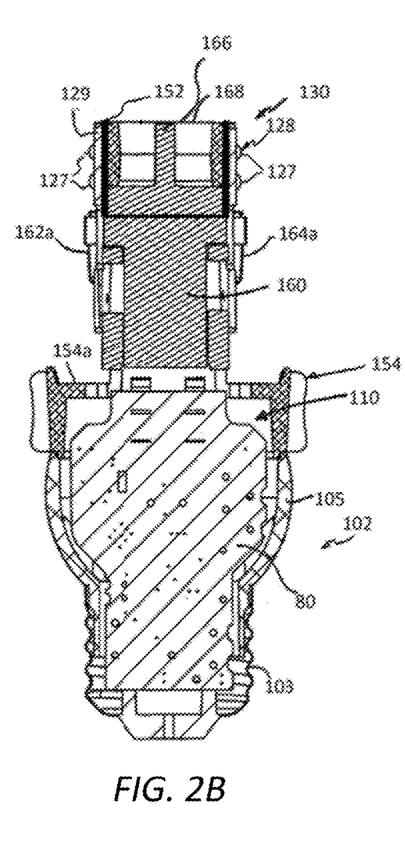
FIG. 2B is a section view taken along line A-A of FIG. 1, rotated 90 degrees.

FIGS. 2A and 2B show sectional views of LED lamp 100 without enclosure 112. In certain aspects of the embodiments, fusible metal is introduced to the LED assembly 130 as further described below. Fusible metal layer 69 is shown deposited about upper area of LED mounting portion 152 of heat sink assembly 149.

Figure 3A:
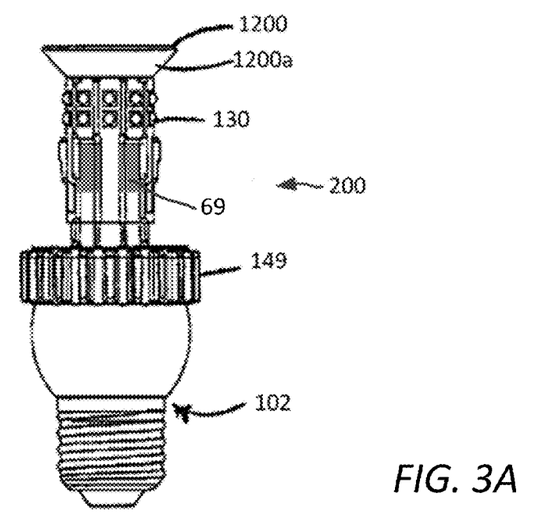
FIGS. 3A, 3B, and 3C show a prospective view of and LED assembly, and prospective views of exemplary PAR-like and BR-like LED lamps, respectively, in accordance with embodiments of the present disclosure.
Figure 3B:
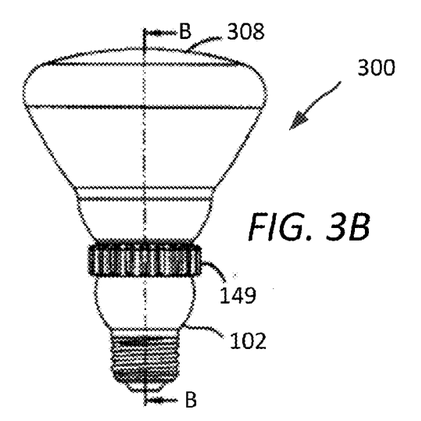
Figure 3C:
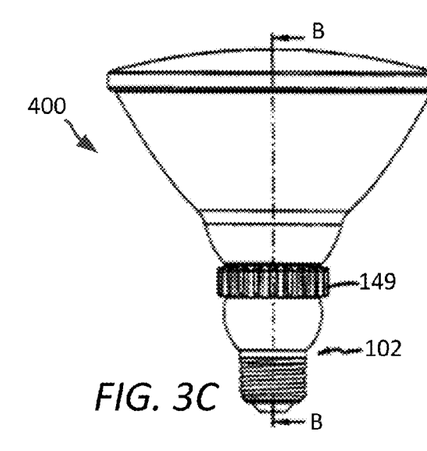

FIG. 3A, FIG. 3B, and FIG. 3C are embodiments of another exemplary LED lamp, more specifically, lamps different from an omnidirectional lamp such as an A19 replacement bulb discussed above. With reference to FIG. 3A, the LED assembly 130 with fusible metal layer 69 may be directed toward an exit surface of the lamp. An LED 127 positioned as described herein may have a beam angle of approximately 120° such that at least some of the light emitted from the LEDs 127 is directed directly out the exit surface. In order to capture this light and shape the beam, a reverse or downward facing reflector 1200 may be added as shown in FIG. 3A. The reflector 1200 captures light that is projected toward the exit surface of the lamp and reflects that light from reflecting surface 1200a to a primary reflector such that the light may be projected in the desired beam angle by the primary reflector (not shown). The lamp may be configured as a directional lamp such as a parabolic aluminized reflector ("PAR") or PAR-style lamp or a BR-style lamp. In other embodiments, the LED lamp can have any shape, including standard and non-standard shapes. A portion of the light generated by the LED assembly may be reflected by a reflective surface. Some of the light generated by the LED assembly 330 may also be projected without being reflected by the reflective surface. In a PAR or BR type lamp the light is emitted in a directional pattern. Standard PAR bulbs are reflector bulbs that reflect light in a direction where the beam angle is tightly controlled using a parabolic reflector. PAR lamps may direct the light in a pattern having a tightly controlled beam angle such as, but not limited to, 10°, 25° and 40°. BR lamps have a directional light pattern where the beam angle is generally speaking less tightly controlled than in a PAR lamp. Standard BR or PAR type bulbs are reflector bulbs that reflect light in a directional pattern; however, the beam angle is not tightly controlled and may be up to about 90-100 degrees or other fairly wide angles. Thus, numerous bulbs can be used in accordance with the methods described herein such as A19, A21, PAR20, PAR30, PAR38, BR30, BR40, R20, etc., type bulbs. Additional examples of LED lamps include those described in co-assigned U.S. application Ser. No. 13/774,078, as filed on Feb. 22, 2013, U.S. application Ser. No. 13/467,670, as filed on May 9, 2012, and U.S. application Ser. No. 13/446,759, as filed on Apr. 13, 2012, all of which are incorporated by reference herein in their entirety.

With reference to FIG. 3B and FIG. 3C, a perspective view of a directional lamps 300, 400, such as a replacement for an incandescent bulb, is shown. The bulbs 300, 400 shown in FIGS. 3B-3C may be used as a solid state replacements for BR-type and PAR-type reflector type bulbs or other similar bulbs. Any suitable reflector 308 may be used as the reverse reflector to redirect the light toward the primary reflector in the BR or PAR bulbs shown in FIG. 3B and FIG. 3C, the light is emitted in a directional pattern rather than in an omnidirectional pattern.

Figure 9A:
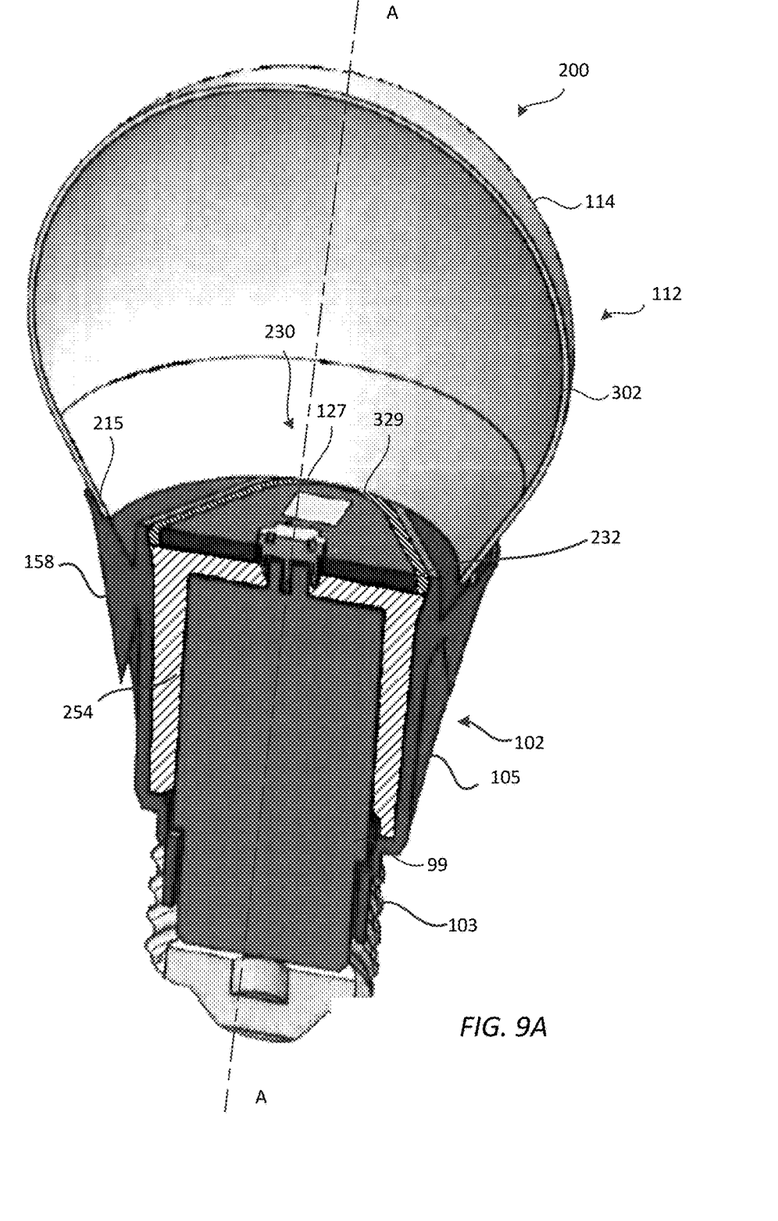
FIG. 9A is a front sectional view of an alternate embodiment of a lamp of the disclosure.
Figure 9B:
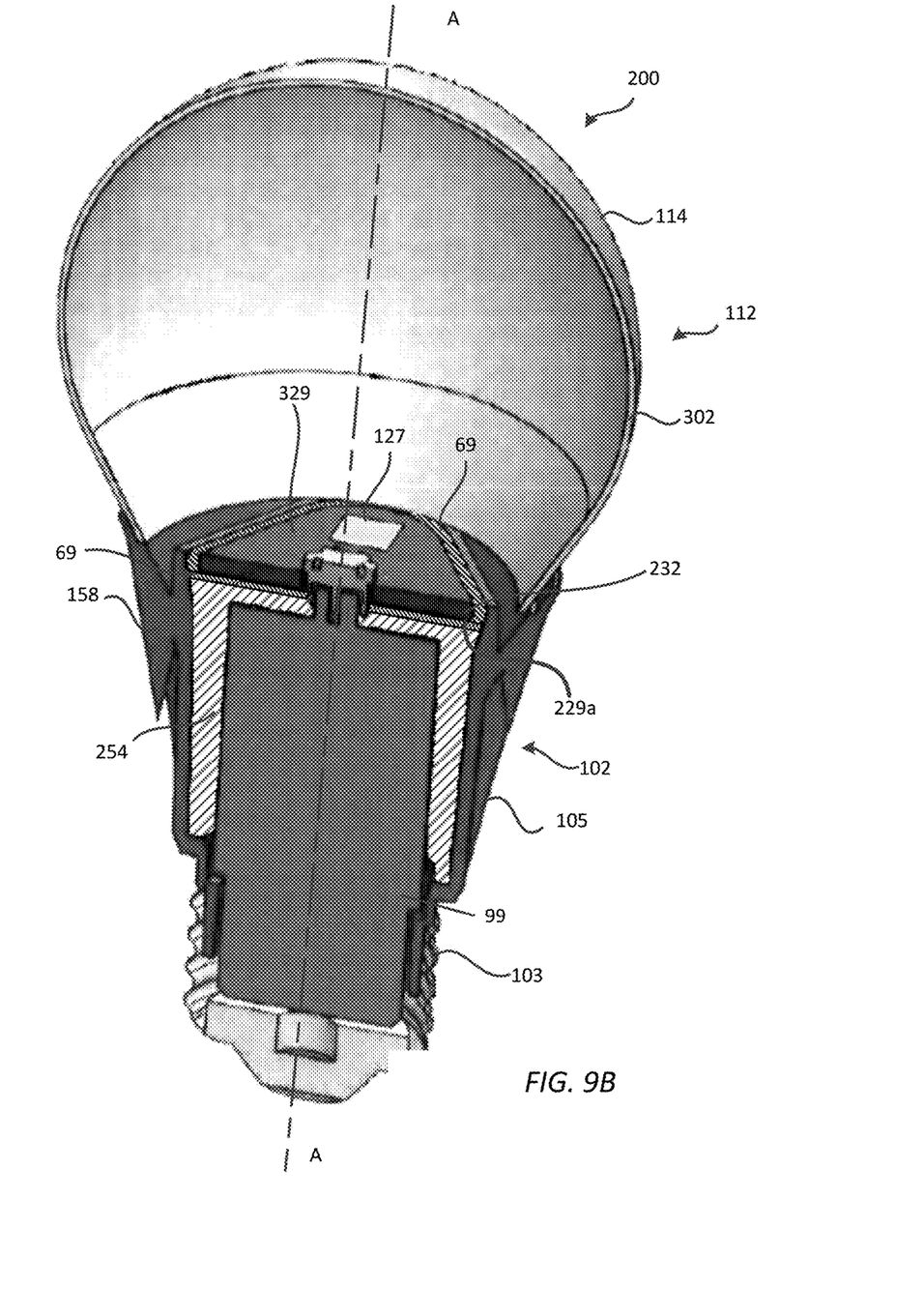
FIG. 9B is a front sectional view of an alternate embodiment of a lamp of the disclosure.

Referring to FIGS. 9A and 9B, LED assembly 230 comprises LED board 329 shown as planar and extending transversely to the longitudinal axis A-A of the lamp 200. LEDs 127 may be arranged on the LED board to emit light primarily upwardly. LED board 229 is supported on a flat transverse support surface 229a that extends transversely to the longitudinal axis of the lamp and is thermally coupled to the heat sink assembly, in some embodiments the LED board 229 and LEDs 127 may be disposed adjacent the neck 215 of the enclosure 112 and not extending into the enclosure or the base 102. Fusible metal layer 69 can be configured to wrap around the exterior perimeter of LED board 229 and optionally may extend below the board for providing improved contact with component 254 of the heat sink assembly 149.

The LEDs 127 may be mounted on the exposed surface of the LED board 229 and may emit light in a variety of patterns. The LED board 329 can be a metal core PCB with one or more of its perimeter edges at least partially surrounded by fusible metal layer 69. Fusible metal layer 69 may completely surround LED board 229 perimeter edge 232. In some embodiments, fusible metal layer 69 may completely surround perimeter edge 232 and be adjacent the support surface 229a as shown in FIG. 9B, such that the fusible metal layer is adjacent to a surface of the LED board opposite that having the at least one LED, as shown in FIG. 9B, in this configuration, the fusible metal layer 69 can be a continuous layer (e.g., wrapping around the perimeter edge and surface opposite the LEDs and providing optional tolerance fit) or can be two or more layers.

The heat sink assembly 149 or other support structure for the LED board 229, such as a heat spreader plate, may have a variety of configurations. Thus, with reference to FIGS. 9A, 9B, the heat sink assembly components may be made of metal such as aluminum or zinc or thermal plastic or other suitable thermally conductive material configured to thermally couple with the fusible metal layer 69. In one embodiment a plurality of heat dissipating members 158 may be formed on the exposed portions of the base housing 105 and/or the enclosure housing 112 to facilitate the heat transfer to the ambient environment, in one embodiment, the heat dissipating members 158 comprise a plurality fins directly or indirectly thermally coupled to the fusible metal layer 69 that extend outwardly to increase the surface area of the heat sink assembly.

The bulb shown in FIGS. 9A, 9B may be used as a solid state replacement for as PAR or BR bulb. Where the lamp is intended to be used as a replacement for a PAR type lamp, the reflector may reflect the light in a tightly controlled beam angle and the reflective surface may comprise a parabolic surface such that light reflecting off of the reflector is emitted from the lamp generally along the axis of the lamp to create a beam with a controlled beam angle. For a BR lamp the reflector may have a variety of configurations.

FIGS. 9A and 9B shows examples where the lamp is configured as a directional lamp suitable for use as a PAR or BR style lamp rather than the omnidirectional lamp of FIGS. 1A, 1B. In some embodiments a reflective surface 302 may be positioned inside of the enclosure housing 112 such that it reflects some of the light generated by the LED 127. In other embodiments the enclosure housing 112 may be made of a optically transparent or non-transparent material and an interior surface of the enclosure 112 may be highly reflective such as by polishing the interior surface or by coating the interior surface of housing with aluminum or other highly reflective material. The enclosure 112 may comprise an optically transmissive exit surface through which the light exits the lamp. The exit surface may be frosted or otherwise treated with a light diffuser and/or notch filter material.

The LED board 229 can include generally aligned apertures for configuration with an electrical interconnects for electrically coupling the LED board 229 to the lamp electronics in the base. The electrical interconnect may comprise conductors for electrically coupling the lamp electronics board to the LED board 229.

In one embodiment the base, heat sink and enclosure is configured for snap-fit connection in a simple insertion operation without the need for any additional connection mechanisms, tools or assembly steps, where the fusible metal layer 69 is inserted between the LED board and a heat sink assembly component optionally providing a tolerance fit between the components.

Methods

Methods of coating as lamp with a fusible metal layer will be described. In some embodiments, a foil of the fusible metal of a thickness compatible with the spacing between the LED board 129 and the LED mounting portion 152 can be sized and positioned in this space. The foil can be wrapped and may extend beyond the end of the LED mounting portion 152 and may be crimped over the end of the portion 152.

Figure 4:
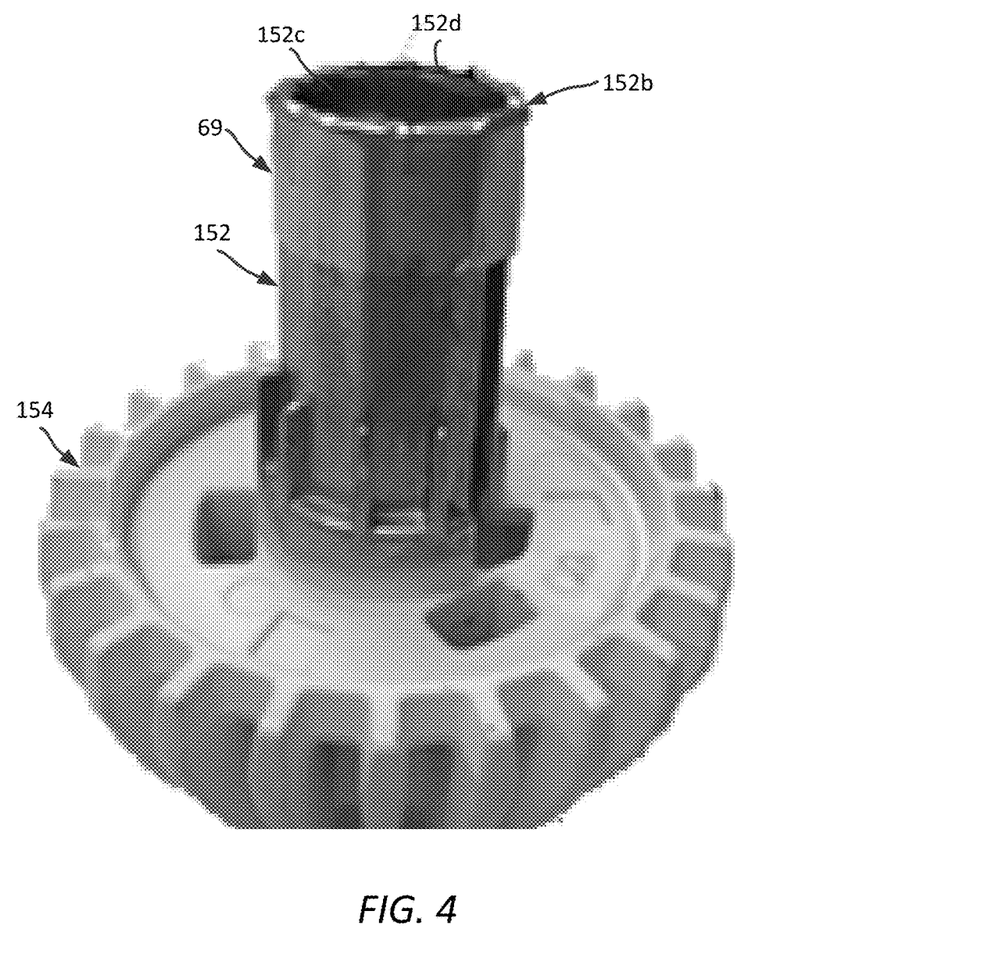
FIG. 4 is a digital image of a heat sink assembly with an exemplary fusible metal layer in accordance with embodiments of the present disclosure.

Thus, as shown in FIG. 4, fusible metal layer 69 as a foil is positioned in proximity to the transverse top surface 152b of LED mounting portion 152. Annular wall 152c of the transverse top surface 152b has an interior annular wall surface 152d that accepts a portion of the foil (e.g., crimped over the top). In this configuration, assembly of the LED board 129 is facilitated substantially without any slippage of the layer 69 as well as providing for or improving a compression fit of the two components together. The fusible alloy layer 69 as a foil and/or LED mounting portion 152 can be heated to a temperature near or exceeding the melt temperature of the foil to allow the foil to conform to the surface of the LED mounting portion prior to after joining of the LED board 129. Alternatively, this arrangement can be configured to allow the fusible metal layer 69 as a foil to conform to the surface of the LED mounting portion 152 after the LED's are energized and the foil is inductively heated during normal use of the lamp.

Figures 5, 6:
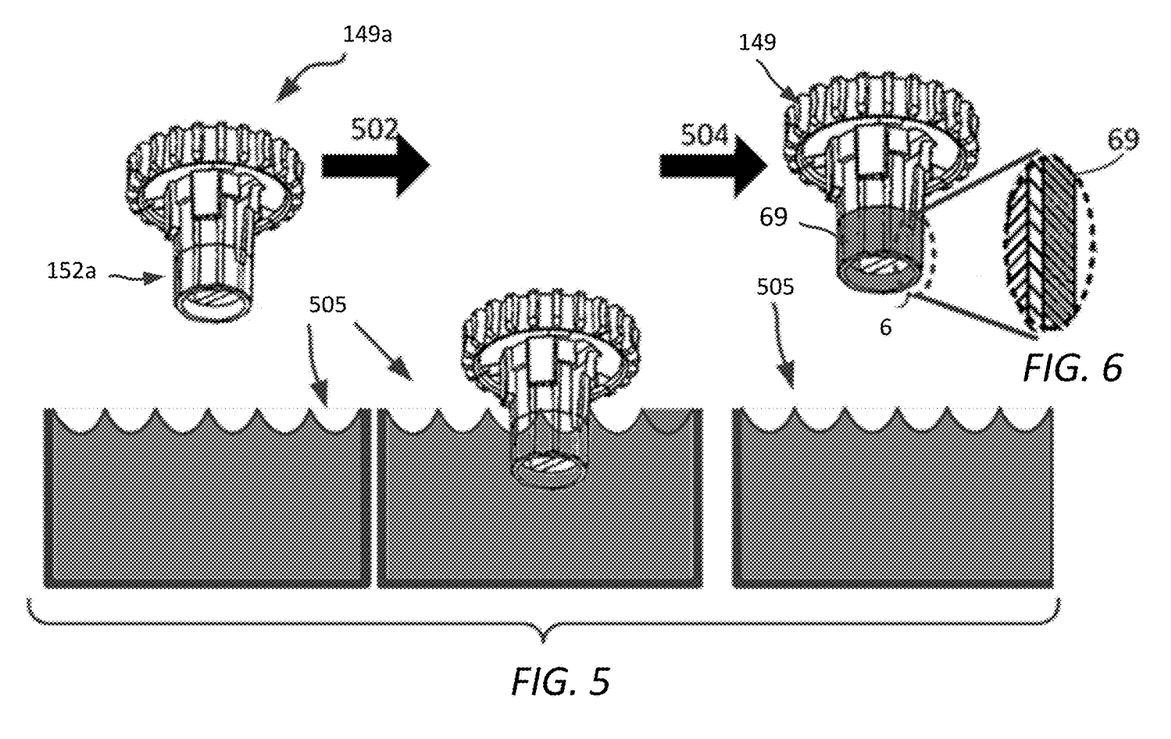
FIG. 5 is an exemplary coating process in accordance with the present disclosure.
FIG. 6 is an partial expanded view of the embodiment depicted in FIG. 5.
Figure 7:
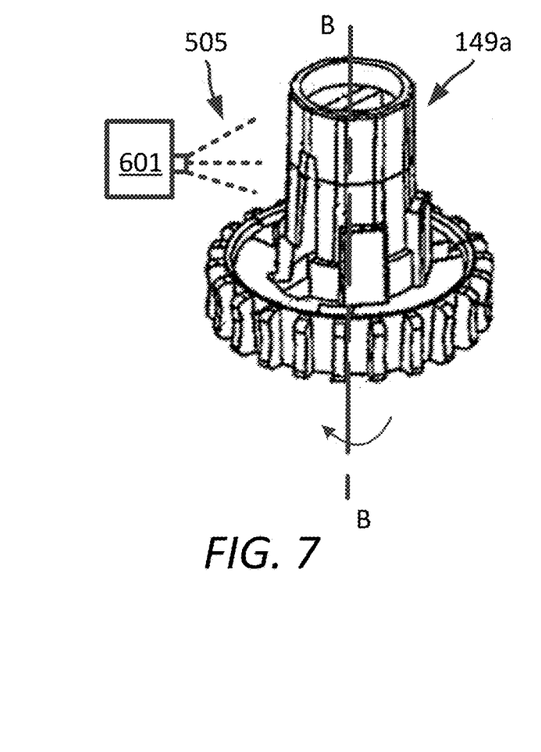
FIG. 7 is an exemplary coating process of a heat sink assembly in accordance with embodiments of the present disclosure.

In some embodiments, any coating method useful for molten materials of similar viscosity to that of the molten fusible metal (mixed or separately) can be used. For example, FIGS. 5, 6, and 7 depict a method where the fusible metal in a molten state can be sprayed, atomized, dipped or rolled on the LED board and/or LED mounting surface of the LED lamp. In some embodiments, the elements of the fusible metal can be melted and then mixed together or can be configured in one or more baths for sequential dipping of the LED mounting portion 152 to provide the same or different fusible metal layers 69. In some aspects, the LED mounting portion 152 can be cascade-coated by passing through one or more flowing streams of molten fusible metal.

FIG. 5 is an exemplary coating process in accordance with embodiments of the present disclosure. Thus, heat sire assembly 149a can be inverted and presented to dip tank containing molten bath 505 of fusible metal or metal. As shown in step 502 LED mounting portion 152a is inserted into molten bath 505 for a time and at a temperature sufficient to provide contact of the molten bath to the LED lamp 100 components. Step 504 illustrates the withdrawal of the coated heat sink assembly component 149 from the bath with fusible metal layer 69. The removal rate in combination with the viscosity and/or concentration of the molten bath 505 can be adjusted to provide a desired fusible metal layer thickness. The resultant alloy layer 69 of at least a portion of the LED mounting portion 152 is shown in expanded view 6 of FIG. 5, showing LED mounting portion 152 having deposited thereon a "conformable" fusible metal layer 69.

FIG. 7 is an exemplary coating process of a heat sink assembly 149a in accordance with embodiments of the present disclosure. As shown, spraying unit 601 dispenses molten fusible metal 505 to heat sink assembly 149a which can be rotated about its longitudinal axis B. Components can be masked so as not to be coated with the alloy.

Figure 8:
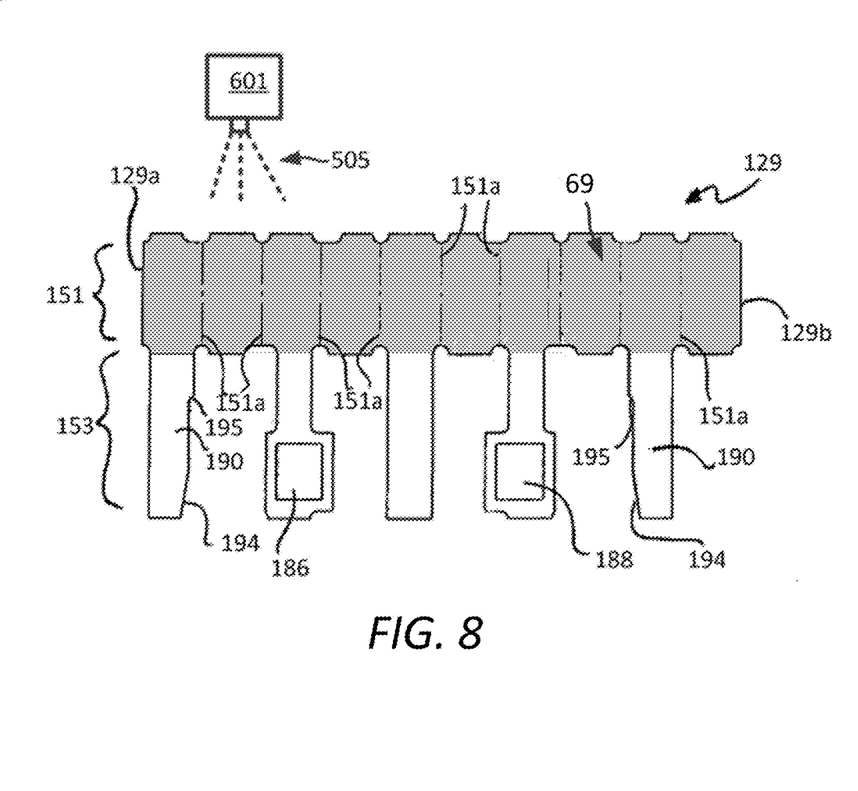
FIG. 8 is an exemplary LED board assembly coated in accordance with the present disclosure.

In some embodiments, such as shown in FIG. 8, fusible metals can be melted and roll coated, brushed, or sprayed on the side 129b (non-LED containing) of the LED board 129 at region 151 that is presented to the exterior surface of the LED mounting portion 152 while not coating side 129a. Masking region 153 can be used to prevent the alloy from coating contacts 186, 188 or structural elements, e.g., 190, 194, 195 of LED board. Any aspect of the methods depicted in FIGS. 5-8 can be combined.

Additional methods of providing the fusible metal layer 69 include sputtering, chemical vapor (assisted) deposition, plasma spraying and electrolytic methods.

After fusible metal is deposited but prior to assembly with other heat management components, it can be worked, for example, it can be polished or lapped to a desired surface roughness or smoothness. The fusible metal layer can be softened (again) prior to assembly, for example, using inductive heating or infra-red heating. The fusible metal can be brought to a temperature near the melting point of the alloy, for example, within 5-100 degrees of a melting or other beyond the melting temperature or softening temperature, depending on the desired mechanical properties of the alloy at the temperature of interest. In some embodiments, the lamp can be configured such that the fusible metal can be brought to a temperature near the melting point of the alloy, for example, within 5-100 degrees of a melting or softening temperature during normal operation or first use so as to conform the fusible metal layer and provide improved thermal contact and heat management.

The LED lamp with the assembled LED board can be cooled to facilitate the physical conforming of the fusible metal between the LED mounting portion and the LED board. The LED lamp can also be designed such that incremental and/or continuous physical conforming of the fusible metal between the LED mounting portion and the LED board occurs during intended use of the LED lamp, thus providing improved heat management throughout the service life of the lamp.

A portion of the light generated by the LED assembly 330 may be reflected by a reflective surface. Some of the light generated by the LED assembly 330 may also be projected without being reflected by the reflective surface. In a PAR or BR type lamp the light is emitted in a directional pattern. Standard PAR bulbs are reflector bulbs that reflect light in a direction where the beam angle is tightly controlled using a parabolic reflector. PAR lamps may direct the light in a pattern having a tightly controlled beam angle such as, but not limited to, 10°, 25° and 40°. BR lamps have a directional light pattern where the beam angle is generally speaking less tightly controlled than in a PAR lamp.

Experimental Data

Various foils as fusible metal layers were tested using a 100 watt A21 LED light fixture assembly. The foils were positioned as shown in FIG. 4 and compared to a device of identical construction but for the fusible metal layer ("the control"). Foils of various thickness were tested, the foils being indium, 58Bi:42Sn (wt:wt); 52In:48Sn; 97In:3Ag; and 57Bi:42Sn:1Ag, representing fusible metal layers comprising two or more metals. The results indicated that placement of a fusible metal layer between the LED board and LED mounting portion of a heat sink assembly provided for a thermal performance improvement, e.g., greater than 5° C. reduction, greater than 7° C. reduction, and greater than 10° C. reduction in operating LED board temperature compared to the control.

Any aspect or features of any of the embodiments described herein can be used with any feature or aspect of any other embodiments described herein or integrated together or implemented separately in single or multiple components.

Although specific embodiments have been illustrated and described herein, those of ordinary skill in the art appreciate that any arrangement, which is calculated to achieve the same purpose, may be substituted for the specific embodiments shown and that the present disclosure has other applications in other environments. This application is intended to cover any adaptations or variations of the present disclosure. The following claims are in no way intended to limit the scope of the present disclosure to the specific embodiments described herein.

I claim:
1. A heat sink assembly comprising:
   an LED mount portion having an external side surface; and
   a fusible metal layer deposited on at least a portion of the external side surface, wherein the fusible metal layer conforms to at least a portion of the external side surface of the LED mount portion, and wherein the fusible metal layer comprises a fusible alloy comprising two or more metals of indium (In), bismuth (Bi), lead (Pb), tin (Sn), cadmium (Cd), zinc (Zn), and thallium (Tl).

2. The heat sink assembly of claim 1, wherein the fusible metal layer conforms to all of the external side surface of the LED mount portion.

3. The heat sink assembly of claim 1, wherein the LED mount portion comprises:
a substantially cylindrical side surface extending from a base, the side surface terminating in a transverse top surface.

4. The heat sink assembly of claim 3, wherein the transverse top surface has an interior annular wall terminating at the top surface.

5. The heat sink assembly of claim 4, wherein the fusible metal layer is at least partially deposited on the interior annular wall.

6. The heat sink assembly of claim 1, wherein the fusible metal layer has a thermal conductivity different from the LED mounting portion.

7. The heat sink assembly of claim 1, wherein the fusible metal layer has a melting temperature between 40° C. and 200° C.

8. The heat sink assembly of claim 1, wherein the two or more metals of the fusible alloy comprises indium.

9. A lamp comprising:
a base having an electrical outlet and an open end separated from the base by an interior space;
an LED board; comprising at least one LED operable to emit light when energized through an electrical path from the base, the LED board having a substantially cylindrical external perimeter surface that terminates in a transverse top surface; and
a heat sink assembly comprising a fusible metal layer, wherein the fusible metal layer is directly adjacent the external perimeter surface and at least partially surrounds the external perimeter surface.

10. The lamp of claim 9, wherein the fusible metal layer has a thermal conductivity different from the LED mounting portion.

11. The lamp of claim 9, wherein the fusible metal layer has a melting temperature between 40° C. and 200° C.

12. The lamp of claim 9, wherein the fusible metal layer is a fusible alloy comprises two or more metals of indium (In), bismuth (Bi), lead (Pb), tin (Sn), cadmium (Cd), zinc (Zn), and thallium (Tl).

13. The heat sink assembly of claim 9, wherein the fusible metal layer is indium.

14. The lamp of claim 9, wherein the LED board is planar or faceted and is transverse to a longitudinal axis of the lamp, wherein the fusible metal layer is directly adjacent the external perimeter surface.

15. The lamp of claim 14, wherein the fusible metal layer is adjacent to a surface of the planar LED board opposite a surface having the at least one LED.

16. A method of manufacturing a heat sink assembly for an LED lamp, the method comprising the steps of:
positioning a fusible metal layer between a LED mounting portion and a LED board having an operating temperature and an external perimeter surface that terminates in a transverse top surface, the fusible metal layer configured for thermally coupling the external perimeter surface of the LED board and the LED mounting portion;
conforming at least a portion of the fusible metal layer to the external perimeter surface of the LED board and directly adjacent to the LED mounting portion during normal operating temperature of the LED board; or prior to normal operating temperature of the LED board and
providing a heat sink assembly.

17. The method of claim 16, wherein the fusible metal layer reduces the operating temperature by at least 5° C.

18. The method of claim 16, wherein the positioning comprises hot dip coating the LED mounting portion in a molten bath of the fusible metal layer.

19. The method of claim 16, wherein the positioning step comprises spray or sputter coating the fusible metal layer on the LED mounting portion or the LED board.

20. The method of claim 16, wherein the fusible metal layer comprises a metal foil.

21. The method of claim 16, wherein the fusible metal layer is a fusible alloy comprises two or more metals of indium (In), bismuth (Bi), lead (Pb), tin (Sn), cadmium (Cd), zinc (Zn), and thallium (Tl).

22. The method of claim 21, wherein the two or more metals of the fusible alloy comprises indium.

* * * * *

UNITED STATES PATENT AND TRADEMARK OFFICE
CERTIFICATE OF CORRECTION

Page 1 of 2

PATENT NO. : 10,168,030 B2
APPLICATION NO. : 14/620516
DATED : January 1, 2019
INVENTOR(S) : Troy A. Trottier It is certified that error appears in the above-identified patent and that said Letters Patent is hereby corrected as shown below:

In the Specification

Column 6, Line 8:
Please correct "FM PCBs" to read -- FR4 PCBs --

Column 6, Line 48:
Please correct "(254 micron)" to read -- (25.4 micron) --

Column 7, Table 1, Line 34:
Please correct "Bi 58: 5n 42" to read -- Bi 58: Sn 42 --

Column 8, Line 39:
Please correct "($Nd(NO_3)_3.6H_2O$)" to read -- ($Nd(NO_3)_3 \cdot 6H_2O$) --

Column 8, Line 40:
Please correct "($Nd(CH_3CO_2)_3.xH_2O$)" to read -- ($Nd(CH_3CO_2)_3 \cdot xH_2O$) --

Column 8, Line 42:
Please correct "($NdPO_4.H_2O$)" to read -- ($NdPO_4 \cdot xH_2O$) --

Column 8, Line 43:
Please correct "($Nd_2(CO_3)_3.xH_2O$)" to read -- ($Nd_2(CO_3)_3 \cdot xH_2O$) --

Column 8, Line 45:
Please correct "($Nd_2O_3.xTiO_2$)" to read -- ($Nd_2O_3 \cdot xTiO_2$) --

Column 8, Line 46:
Please correct "($NdCl_3.6H_2O$)" to read -- ($NdCl_3 \cdot 6H_2O$) --

Signed and Sealed this
Fourth Day of June, 2019

Andrei Iancu
*Director of the United States Patent and Trademark Office*

CERTIFICATE OF CORRECTION (continued)

Column 8, Line 46:
Please correct "(NdF)" to read -- (NdF$_3$) --

Column 8, Line 47:
Please correct "(Nd$_2$(SO$_4$)$_3$.xH$_2$O)" to read -- (Nd$_2$(SO$_4$)$_3$ • xH$_2$O) --

Column 8, Line 49:
Please correct "(Er(NO$_3$)$_3$.5H$_2$O)" to read -- (Er(NO$_3$)$_3$ • 5H$_2$O) --

Column 8, Lines 49-50:
Please correct "(Er$_2$(C$_2$O$_4$)$_3$.xH$_2$O)" to read -- (Er$_2$(C$_2$O$_4$)$_3$ • xH$_2$O) --

Column 8, Lines 50-51:
Please correct "(Er(CH$_3$CO$_2$)$_3$.xH$_2$O)" to read -- (Er(CH$_3$CO$_2$)$_3$ • xH$_2$O) --

Column 8, Line 51:
Please correct "(ErPO$_4$.xH$_2$O)" to read -- (ErPO$_4$ • xH$_2$O) --

Column 8, Line 53:
Please correct "(Sm(NO$_3$)$_3$.6H$_2$O)" to read -- (Sm(NO$_3$)$_3$ • 6H$_2$O) --

Column 8, Lines 53-54:
Please correct "(Sm(CH$_3$CO$_2$)$_3$.xH$_2$O)" to read -- (Sm(CH$_3$CO$_2$)$_3$ • xH$_2$O) --

Column 8, Line 55:
Please correct "(SmPO$_4$xH$_2$O)" to read -- (SmPO$_4$ • xH$_2$O) --

Column 8, Line 56:
Please correct "(Sm(OH)$_3$.xH$_2$O)" to read -- (Sm(OH)$_3$ • xH$_2$O) --

Column 8, Line 57:
Please correct "(Ho(NO$_3$)$_3$.5H$_2$O)" to read -- (Ho(NO$_3$)$_3$ • 5H$_2$O) --

Column 8, Line 58:
Please correct "((CH$_3$CO$_2$)$_3$Ho.xH$_2$O)" to read -- ((CH$_3$CO$_2$)$_3$Ho • xH$_2$O) --

Column 8, Line 59:
Please correct "holmium (iii) oxide" to read -- holmium (III) oxide --

Column 9, Line 51:
Please correct "FIG. 18" to read -- FIG. 1B --